(12) United States Patent
Chen et al.

(10) Patent No.: US 6,444,505 B1
(45) Date of Patent: Sep. 3, 2002

(54) THIN FILM TRANSISTOR (TFT) STRUCTURE WITH PLANARIZED GATE ELECTRODE

(75) Inventors: Dou-I Chen, Nan-Tou Xian; Jr-Hong Chen, Xin-Zhu; Pi-Fu Chen, Taipei; Wung-Ui Huang, Xin-Zhu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 17 days.

(21) Appl. No.: 09/678,552

(22) Filed: Oct. 4, 2000

(51) Int. Cl.⁷ .......................... H01L 21/00; H01L 21/84
(52) U.S. Cl. .................. 438/149; 438/160; 438/30; 257/158; 257/59; 257/66
(58) Field of Search ............................ 438/149, 160, 438/30, 159; 257/158, 59, 66

(56) References Cited

U.S. PATENT DOCUMENTS

| | | | | |
|---|---|---|---|---|
| 5,137,597 A | * | 8/1992 | Curry, II et al. | 156/636 |
| 5,156,986 A | * | 10/1992 | Wei et al. | 437/40 |
| 5,356,513 A | * | 10/1994 | Burke et al. | 156/636 |
| 5,510,652 A | * | 4/1996 | Burke et al. | 257/752 |
| 5,674,784 A | * | 10/1997 | Jang et al. | 437/195 |
| 5,960,316 A | * | 9/1999 | Bai | 438/633 |
| 6,001,539 A | | 12/1999 | Lyu et al. | 430/317 |
| 6,048,800 A | * | 4/2000 | Nagashima et al. | 438/761 |
| 6,159,779 A | * | 12/2000 | Huang et al. | 438/158 |
| 6,218,206 B1 | * | 4/2001 | Inoue et al. | 438/30 |
| 6,218,285 B1 | * | 4/2001 | Lou | 438/624 |
| 6,255,211 B1 | * | 7/2001 | Olsen et al. | 438/624 |
| 6,323,069 B1 | * | 11/2001 | Yamazaki et al. | 438/160 |

OTHER PUBLICATIONS

"Fully Planarized –Si:H TFTs For AM–LCDs" Proceedings of AMLCD 98, Kogakuin University, Tokyo, Jul. 9–10, 1998, pp. 77–80.

"High Performance Amorphous Silicon Thin Film Transistor with a Planarized $SiN_x$/BCB Double Layered Gate Insulator", Proceedings of AMLCD 98, Kogakuin University, Tokyo, Jul. 9–10, 1998, pp. 73–76.

* cited by examiner

Primary Examiner—Vu A. Le
Assistant Examiner—Michael K. Luhrs
(74) Attorney, Agent, or Firm—Tung & Associates

(57) ABSTRACT

Within a method for forming a thin film transistor (TFT) structure, there is first provided a substrate. There is then formed over the substrate a gate electrode. There is then formed adjacent to the gate electrode but not covering a top surface of the gate electrode a backfilling dielectric layer. There is then formed over and covering the top surface of the gate electrode a gate dielectric layer. There is then formed over and covering the gate dielectric layer an active semiconductor layer. Finally, there is then formed over and in electrical communication with the active semiconductor layer a pair of source/drain electrodes, where the pair of source/drain electrodes having a separation distance which defines a channel region of the active semiconductor layer. The method for forming the thin film transistor (TFT) structure contemplates a thin film transistor (TFT) structure fabricated in accord with the method for forming the thin film transistor (TFT) structure. The method provides the thin film transistor (TFT) structure with enhanced functionality and reliability.

9 Claims, 1 Drawing Sheet

THIN FILM TRANSISTOR (TFT) STRUCTURE WITH PLANARIZED GATE ELECTRODE

BACKGROUND OF THE INVENTION

1. Field of the Invention

The present invention relates generally to methods for forming thin film transistor (TFT) structures which may be employed within liquid crystal display (LCD) fabrications. More particularly, the present invention relates to planarizing methods for forming thin film transistor (TFT) structures which may be employed within liquid crystal display (LCD) fabrications.

2. Description of the Related Art

Liquid crystal display (LCD) fabrications are employed as user interface devices within various types of information technology products, such as, but are not limited to, personal computer products, portable computer products and computer terminal products.

Common in the fabrication of liquid crystal display (LCD) fabrications is the use of a series of thin film transistor (TFT) structures which serves as a series of switching elements which in turn activates a series of pixel electrodes which in turn provides for operation of the liquid crystal display (LCD) fabrication.

While thin film transistor (TFT) structures are thus common and often essential in the art of liquid crystal display (LCD) fabrication, thin film transistor (TFT) structures are nonetheless not entirely without problems within the art of liquid crystal display (LCD) fabrication. In that regard, it is common in the art of thin film transistor (TFT) structure fabrication, and for purposes of providing liquid crystal displays (LCD) fabrications with enhanced performance, to employ when fabricating thin film transistor (TFT) structures within liquid crystal display (LCD) fabrications various microelectronic layers of high aspect ratio such as to ultimately provide liquid crystal display (LCD) fabrications having an increased pixel aperture ratio. As is common in the art of microelectronic fabrication in general, however, microelectronic layers of high aspect ratio when formed within thin film transistor (TFT) structures employed within liquid crystal display (LCD) fabrications often provide irregular surfaces upon which it is difficult to subsequently form additional microelectronic layers which are needed to form fully functional or reliable thin film transistor (TFT) structures or liquid crystal display (LCD) fabrications.

It is thus towards the goal of forming, with enhanced functionality and reliability, thin film transistor (TFT) structures which may employ high aspect ratio microelectronic layers, which in turn provide liquid crystal display (LCD) fabrications with enhanced performance, that the present invention is directed.

Various methods and materials have been disclosed in the arts of thin film transistor (TFT) structure fabrication and liquid crystal display (LCD) fabrication fabrication for forming thin film transistor (TFT) structures and liquid crystal display (LCD) fabrications with desirable properties. For example, Lan et al., in "Fully Planarized α-Si:H TFTs for AM-LCDs," Proceedings of AMLCD 98 Kogakuin University, Tokyo, Jul. 9–10, 1998, pp. 77–80, discloses methods and materials which may be employed for both: (1) locally planarizing a series of gate electrode structures within a series of thin film transistors (TFT) structures which may be employed within a liquid crystal display (LCD) fabrication; and (2) globally planarizing the series of thin film transistor (TFT) structures as a whole which may be employed within the liquid crystal display (LCD) fabrication. The method employs as a planarizing material for both locally planarizing the series of gate electrode structures and globally planarizing the series of thin film transistor (TFT) structures a benzocyclobutene (BCB) planarizing material.

In addition, Lim et al., in "High Performance Amorphous Silicon Thin Film Transistor with a Planarized $SiN_x$/BCB Double Layered Gate Insulator," Proceedings of AMLCD 98 Kogakuin University, Tokyo, Jul. 9–10, 1998, pp. 73–76, discloses a method for forming a thin film transistor (TFT) structure which may be employed within a liquid crystal display (LCD) fabrication, where the thin film transistor (TFT) structure is formed with enhanced performance of the thin film transistor (TFT) structure for use within the liquid crystal display (LCD) fabrication. The thin film transistor (TFT) structure realizes the foregoing object by employing when fabricating the thin film transistor (TFT) structure a gate dielectric layer formed as a bilayer of a first dielectric layer formed of a benzocyclobutene (BCB) material, the first dielectric layer in turn having formed thereupon a second dielectric layer formed of a silicon nitride dielectric material.

Finally, Lyu et al., in U.S. Pat. No. 6,001,539, discloses a method for forming over a thin film transistor (TFT) structure for use within a liquid crystal display (LCD) fabrication a passivation layer which simultaneously provides an enhanced planarization of the thin film transistor (TFT) structure and an enhanced adhesion of a pixel electrode layer formed upon the passivation layer. To realize the foregoing objects, the method employs the passivation layer formed at least in part of an organo-silicon planarizing material such that due to flow characteristics of the organo-silicon material the passivation layer may be formed with enhanced planarization upon a thin film transistor (TFT) structure, and such that upon oxygen plasma oxidation of the passivation layer there may be formed a silicon oxide material which provides for enhanced adhesion of a pixel electrode formed upon the oxygen plasma oxidized passivation layer.

Desirable in the art of microelectronic fabrication are additional methods and materials which may be employed for forming, with enhanced functionality and reliability, thin film transistor (TFT) structures which may employ high aspect ratio microelectronic layers, which in turn provide liquid crystal display (LCD) fabrications with enhanced performance.

It is towards the foregoing objects that the present invention is directed.

SUMMARY OF THE INVENTION

A first object of the present invention is to provide a method for forming a thin film transistor (TFT) structure which may be employed within a liquid crystal display (LCD) fabrication.

A second object of the present invention is to provide a method for forming a thin film transistor (TFT) structure in accord with the first object of the present invention, wherein the thin film transistor (TFT) structure is formed with enhanced functionality and reliability.

A third object of the present invention is to provide a method for forming a thin film transistor (TFT) structure in accord with the first object of the present invention or the second object of the present invention, which method is readily commercially implemented.

In accordance with the objects of the present invention, there is provided by the present a method for forming a thin film transistor (TFT) structure which may be employed within a liquid crystal display (LCD) fabrication.

To practice the method of the present invention, there is first provided a substrate. There is then formed over the substrate a gate electrode. There is then formed adjacent to the gate electrode but not covering a top surface of the gate electrode a backfilling dielectric layer. There is then formed over and covering the top surface of the gate electrode a gate dielectric layer. There is then formed over and covering the gate dielectric layer an active semiconductor layer. Finally, there is then formed over and in electrical communication with the active semiconductor layer a pair of source/drain electrodes, where the pair of source/drain electrodes has a separation distance which defines a channel region of the active semiconductor layer.

The method for forming the thin film transistor (TFT) structure in accord with the present invention contemplates a thin film transistor (TFT) structure formed in accord with the method for forming the thin film transistor (TFT) structure in accord with the present invention.

The present invention provides a method for forming a thin film transistor (TFT) structure which may be employed within a liquid crystal display (LCD) fabrication, wherein the thin film transistor (TFT) structure is formed with enhanced functionality and reliability. The present invention realizes the foregoing object by employing when forming the thin film transistor (TFT) structure for use within the liquid crystal display (LCD) fabrication a backfilling dielectric layer formed adjacent a gate electrode formed over a substrate, where the backfilling dielectric layer is not formed covering a top surface of the gate electrode formed over the substrate. By employing such a backfilling dielectric layer there is compensated a topographic variation of the gate electrode within the thin film transistor (TFT) structure such that the thin film transistor (TFT) structure may be formed with enhanced functionality and reliability.

The method of the present invention is readily commercially implemented. The present invention employs methods and materials as are generally known in the art of microelectronic fabrication, but employed within the context of specific process limitations and structural limitations to provide the present invention. Since it is thus a process limitation and a structural limitation which provides at least in part provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a thin film transistor (TFT) structure which may be employed within a liquid crystal display (LCD) fabrication, wherein the thin film transistor (TFT) structure is formed with enhanced functionality and reliability. The present invention realizes the foregoing objects by employing when fabricating the thin film transistor (TFT) structure a backfilling dielectric layer formed adjacent a gate electrode formed over a substrate, where the backfilling dielectric layer is not formed covering a top surface of the gate electrode formed over the substrate.

Although the present invention provides particular value for forming a thin film transistor (TFT) structure which may be employed within a liquid crystal display (LCD) fabrication, the present invention may in general be employed for forming thin film transistor (TFT) structures for use within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
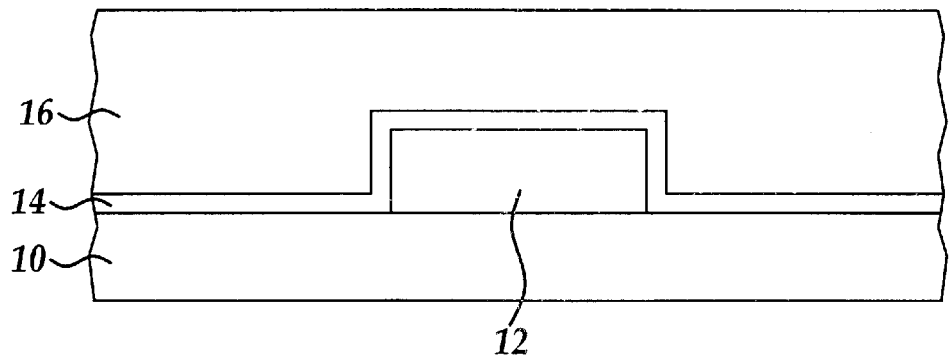
FIG. 1, FIG. 2 and FIG. 3 show a series of schematic cross-sectional diagrams illustrating the results of forming, in accord with a preferred embodiment of the present invention, a thin film transistor (TFT) structure which may be employed within a liquid display (LCD) fabrication.
Figure 2:
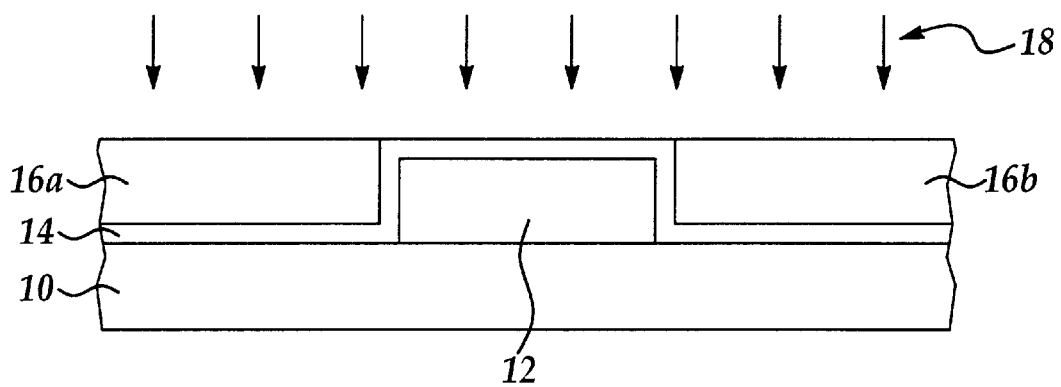
Figure 3:
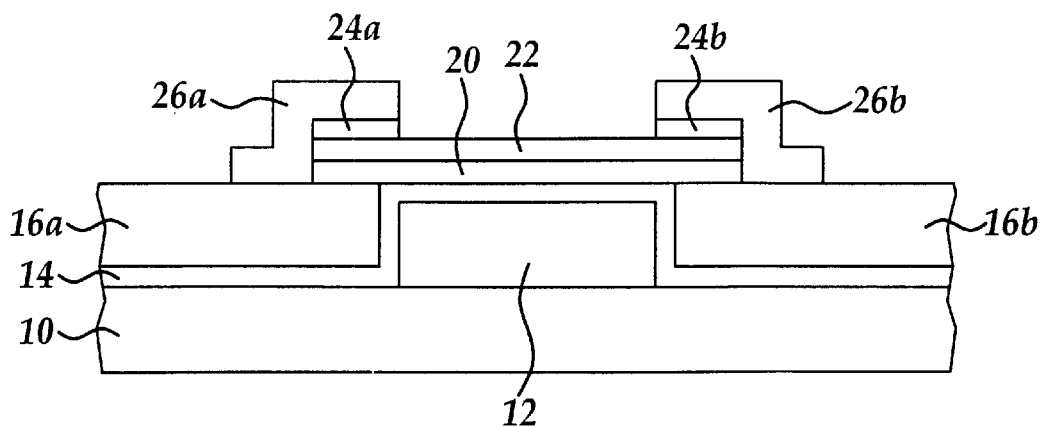

Referring now to FIG. 1 to FIG. 3, there is shown a series of schematic cross-sectional diagrams illustrating the results of forming, in accord with a preferred embodiment of the present invention, a thin film transistor (TFT) structure which may be employed within a liquid crystal display (LCD) fabrication.

Shown in FIG. 1 is a schematic cross-sectional diagram of the thin film transistor (TFT) structure at an early stage in its fabrication in accord with the preferred embodiment of the present invention.

Shown in FIG. 1, in a first instance, is a substrate 10 having formed thereover and thereupon a gate electrode 12. Within the preferred embodiment of the present invention with respect to the substrate 10, the substrate 10 is typically and preferably a substrate employed within a liquid crystal display (LCD) fabrication, although, as noted above, the method of the present invention may be employed when fabricating thin film transistor (TFT) structures within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Within the preferred embodiment of the present invention when the substrate 10 is employed within a display image array optoelectronic microelectronic fabrication, such as in particular a liquid crystal display (LCD) image array optoelectronic microelectronic fabrication, the substrate 10 typically and preferably comprises at least in part a transparent substrate, such as but not limited to a transparent glass substrate or a transparent quartz substrate.

Within the preferred embodiment of the present invention with respect to the gate electrode 12, the gate electrode 12 may be formed employing methods and materials as are similarly conventional in the art of microelectronic fabrication, and in particular in the art of liquid crystal display (LCD) image array optoelectronic microelectronic fabrication, for forming gate electrodes. Such methods typically and preferably employ photolithographic methods which provide gate electrodes formed of conductor materials including but not limited to metal, metal alloy, doped polysilicon (having a dopant concentration of from about $10^{12}$ to about $10^{24}$ atoms per cubic centimeter) and polycide (doped polysilicon/metal silicide stack) conductor materials. Typically and preferably, the gate electrode 12 is formed of a metal or metal alloy conductor material, in particular to facilitate adhesion with respect to a substrate 10 formed of a transparent material as employed within a liquid crystal display (LCD) image array optoelectronic microelectronic fabrication. More typically and preferably, the gate electrode 12 is formed of a chromium, chromium alloy, aluminum or aluminum alloy conductor material, formed to a thickness of from about 2,000 to about 15,000 angstroms, and of a bidirectional linewidth of from about 3 to about 100 microns.

Shown also within the schematic cross-sectional diagram of FIG. 1, formed conformally upon the gate electrode 12 and bridging to otherwise exposed portions of the substrate 10 is a blanket first dielectric layer 14.

Within the preferred embodiment of the present invention, the blanket first dielectric layer 14 may be formed from any of several dielectric materials as are conventional in the art of microelectronic fabrication, such dielectric materials being selected from the group of dielectric materials including but not limited to silicon oxide dielectric materials, silicon nitride dielectric materials and silicon oxynitride dielectric materials. Typically and preferably, the blanket first dielectric layer 14 is formed of a silicon nitride dielectric material formed to a thickness of from about 500 Å to about 5,000 Å. As is understood by a person skilled in the art, and within the context of the present invention as further disclosed below, the blanket first dielectric layer is optional within the present invention, although typically preferred within the present invention. Similarly, although not specifically illustrated within the schematic cross-sectional diagram of FIG. 1, the presence of the blanket first dielectric layer 14 facilitates planarization of a blanket backfilling dielectric layer 16 formed thereupon, such planarization also being discussed in further detail below.

Finally, there is also shown within the schematic cross-sectional diagram of FIG. 1 formed upon the blanket first dielectric layer 14 the blanket backfilling dielectric layer 16.

Within the preferred embodiment of the present invention with respect to the blanket backfilling dielectric layer 16, the blanket backfilling dielectric layer 16 is typically and preferably formed of a dielectric material of sufficiently divergent chemical and/or physical properties with respect to the blanket first dielectric layer 14 such that the blanket first dielectric layer 14 acts as a stop layer (and as noted above provides for enhanced planarization) when removing portions of the blanket backfilling dielectric layer 16. Thus, within the preferred embodiment of the present invention, although the blanket backfilling dielectric layer 16 may be formed of dielectric materials including but not limited to inorganic dielectric materials, organic dielectric materials and hybrids thereof, and more particularly lower dielectric constant inorganic dielectric materials and lower dielectric constant organic dielectric materials and hybrids thereof (i.e., dielectric materials having a lower dielectric constant of from about 1 to about 10, in comparison with a higher dielectric constant of from about 10 to about 30 as is typical for conventional inorganic dielectric materials such as but not limited to silicon oxide dielectric materials, silicon nitride dielectric materials and silicon oxynitride dielectric materials), for the preferred embodiment of the present invention, the blanket backfilling dielectric layer 16 is typically and preferably formed of a lower dielectric constant organic dielectric material, such as but not limited to a polyimide organic dielectric material, a polyarylene ether organic dielectric material or most preferably a benzocyclobutene (BCB) organic dielectric material. Typically and preferably, the blanket backfilling dielectric layer 16 is formed to a thickness of from about 4,000 to about 40,000 angstroms, while preferably at least partially planarizing the gate electrode 12.

Referring now to FIG. 2, there is shown a schematic cross-sectional diagram illustrating the results of further processing of the thin film transistor (TFT) structure whose schematic cross-sectional diagram is illustrated in FIG. 1.

Shown in FIG. 2 is a schematic cross-sectional diagram of a thin film transistor (TFT) structure otherwise equivalent to the thin film transistor (TFT) structure whose schematic cross-sectional diagram is illustrated in FIG. 1, but wherein the blanket backfilling dielectric layer 16 has been etched back to form a pair of patterned backfilling dielectric layers 16a and 16b, through use of an etch-back plasma 18. As is illustrated within the schematic cross-sectional diagram of FIG. 2, the blanket backfilling dielectric layer 16 is etched back to form the pair of patterned backfilling dielectric layers 16a and 16b, while employing the etchback plasma 18, for a sufficient period of time such that there is completely etched from over the gate electrode 12 any of the blanket backfilling dielectric layer 16, thus there is formed in accord with the schematic cross-sectional diagram of FIG. 2 the pair of patterned backfilling dielectric layers 16a and 16b adjacent the gate electrode 12 but not covering a top surface of the gate electrode 12. Within the preferred embodiment of the present invention the top surface of the gate electrode 12 is also intended to include the interface of the upper portion of the gate electrode 12 with the blanket first dielectric layer 14.

Within the preferred embodiment of the present invention when the blanket backfilling dielectric layer 16 is formed of a benzocyclobutene (BCB) dielectric material, the etchback plasma 18 typically and preferably employs a fluorine containing etchant gas (such as but not limited to a perfluorocarbon, a hydrofluorocarbon, sulfur hexafluoride or nitrogen trifluoride) and an oxygen containing etchant gas (such as but not limited to oxygen, ozone, nitrous oxide or nitric oxide). More typically and preferably, the etchback plasma 18 employs a sulfur hexafluoride fluorine containing etchant gas and an oxygen containing etchant gas. Typically and preferably, the etchback plasma 18 also employs: (1) a reactor chamber pressure of from about $10^{-3}$ to about $10^{-6}$ torr; (2) a radio frequency power of from about 600 to about 2,000 watts and a bias power of from about 100 V to about 2,000 V; (3) a sulfur hexafluoride flow rate of from about 10 SCCM to about 100 SCCM; and (4) an oxygen flow rate of from about 100 SCCM to about 500 SCCM. The etching time used is between about 100 sec. and about 500 sec.

As is understood by a person skilled in the art, although the preferred embodiment of the present invention illustrates the present invention within the context of the etchback plasma 18 etching of the blanket backfilling dielectric layer 16 when forming the pair of patterned backfilling dielectric layers 16a and 16b, it is also plausible within the context of the present invention that alternative methods may also be employed for forming from a blanket backfilling dielectric layer, such as the blanket backfilling dielectric layer 16, a pair of patterned backfilling dielectric layers, such as the pair of patterned backfilling dielectric layers 16a and 16b, where under appropriate circumstances such alternative methods may include, but are not limited to, mechanical polishing methods and chemical mechanical polish (CMP) planarizing methods.

Referring now to FIG. 3, there is shown a schematic cross-sectional diagram illustrating the results of further processing of the thin film transistor (TFT) structure whose schematic cross-sectional diagram is illustrated in FIG. 2.

Shown in FIG. 3 is a schematic cross-sectional diagram of a thin film transistor (TFT) structure otherwise equivalent to the thin film transistor (TFT) structure whose schematic cross-sectional diagram is illustrated in FIG. 2, but wherein, in a first instance, there is formed upon exposed portions of the blanket first dielectric layer 14 and bridging to the pair of patterned backfilling dielectric layers 16a and 16b a patterned third dielectric layer 20 having formed and aligned thereupon a patterned active semiconductor layer 22. Within the preferred embodiment of the present invention, the patterned third dielectric layer 20 serves at least in part as a gate dielectric layer within the thin film transistor (TFT) structure whose schematic cross-sectional diagram is illustrated in FIG. 3.

Within the preferred embodiment of the present invention with respect to the patterned third dielectric layer 20, the patterned third dielectric layer 20 is typically and preferably formed employing methods and materials analogous or equivalent to the methods and materials employed for forming the blanket first dielectric layer 14. Typically and preferably, the patterned third dielectric layer 20 is formed to a thickness of from about 1,000 to about 6,000 angstroms through means of patterning of a corresponding blanket third dielectric layer.

Within the preferred embodiment of the present invention with respect to the patterned active semiconductor layer 22, although the patterned active semiconductor layer 22 may be formed employing methods and materials as are similarly conventional in the art of thin film transistor (TFT) structure fabrication for forming active semiconductor layers within thin film transistor (TFT) structures, to provide the patterned active semiconductor layer 22 formed of any of several active semiconductor materials, for the preferred embodiment of the present invention the patterned active semiconductor layer 22 is typically and preferably formed of an active silicon semiconductor material such as but not limited to an active amorphous silicon semiconductor material or an active polysilicon silicon semiconductor material, but more preferably an active amorphous silicon semiconductor material. Typically and preferably, the patterned active semiconductor layer 22 is formed of an amorphous silicon semiconductor material, having incorporated therein a dopant at a concentration of from about $10^{15}$ to about $10^{18}$ dopant atoms per cubic centimeter, where the patterned active semiconductor layer 22 has been patterned from a corresponding blanket active semiconductor layer. Typically and preferably, the patterned active semiconductor layer 22 is formed to a thickness of from about 100 to about 5,000 angstroms.

Shown also within the schematic cross-sectional diagram of FIG. 3 formed contacting a pair of opposite ends of the patterned active semiconductor layer 22 is a pair of patterned ohmic contact layers 24a and 24b having formed and aligned thereupon a pair of patterned conductor layers 26a and 26b, where the pair of patterned conductor layers 26a and 26b forms a pair of source/drain regions within the thin film transistor (TFT) structure whose schematic cross-sectional diagram is illustrated in FIG. 3. Within the present invention and the preferred embodiment of the present invention, a separation distance of the pair of patterned conductor layers 26a and 26b defines a channel region of the patterned active semiconductor layer 22.

Within the preferred embodiment of the present invention with respect to the pair of patterned ohmic contact layers 24a and 24b, although the pair of patterned ohmic contact layers 24a and 24b is in general optional within the thin film transistor (TFT) structure whose schematic cross-sectional diagram is illustrated in FIG. 3, a the pair of patterned ohmic contact layers 24a and 24b is typically and preferably desirable within the thin film transistor (TFT) structure whose schematic cross-sectional diagram is illustrated in FIG. 3 under circumstances where the patterned active semiconductor layer 22 is formed of an amorphous silicon active semiconductor material, since the pair of patterned ohmic contact layers 24a and 24b will under such circumstances provide for enhanced conductivity of the pair of patterned conductor layers 26a and 26b with respect to the patterned active semiconductor layer 22. Typically and preferably, the pair of patterned ohmic contact layers 24a and 24b is formed of a doped polysilicon material having incorporated therein a dopant at a concentration of from about $10^{15}$ to about $10^{20}$ dopant atoms per cubic centimeter. Typically and preferably, the pair of patterned ohmic contact layers 24a and 24b is formed from a corresponding blanket ohmic contact layer which in a first instance is patterned sequentially with the blanket active semiconductor layer and the blanket third dielectric layer from which is formed the corresponding patterned active semiconductor layer 22 and corresponding patterned third dielectric layer 20, while the resulting singly patterned ohmic contact layer is subsequently additionally patterned while employing the pair of patterned conductor layers 26a and 26b as an etch mask layer, to form therefrom the pair of patterned ohmic contact layers 24a and 24b. Typically and preferably, the pair of patterned ohmic contact layers 24a and 24b is formed to a thickness of from about 0 to about 1,000 angstroms each.

Finally, with respect to the pair of patterned conductor layers 26a and 26b as illustrated within the schematic cross-sectional diagram of FIG. 1, the pair of patterned conductor layers 26a and 26b may be formed of conductor materials as are conventional in the art of microelectronic fabrication, and in particular within the art of thin film transistor (TFT) structure fabrication within microelectronic fabrication, and in particular within the art of thin film transistor (TFT) fabrication within liquid crystal display (LCD) microelectronic fabrications, to provide the pair of patterned conductor layers of a conductor material selected from the group including but not limited to metal, metal alloy, doped polysilicon and polycide conductor materials. Typically and preferably, within the preferred embodiment of the present invention, the pair of patterned conductor layers 26a and 26b is formed, in progressive order, of a laminate of a chromium layer formed to a thickness of from about 500 to about 5,000 angstroms, having formed thereupon an aluminum layer formed to a thickness of from about 1,000 to about 8,000 angstroms, further in turn having formed thereupon a chromium layer formed to a thickness of from about 500 to about 5,000 angstroms.

Upon forming the thin film transistor (TFT) structure whose schematic cross-sectional diagram is illustrated in FIG. 3, there is fabricated in accord with the present invention and the preferred embodiment of the present invention a thin film transistor (TFT) structure which may be employed within a microelectronic fabrication, and in particularly within a liquid crystal display (LCD) optoelectronic microelectronic fabrication, with enhanced functionality and reliability. The present invention realizes the foregoing object by employing when fabricating the thin film transistor (TFT) structure a pair of backfilling dielectric layers formed adjacent a gate electrode within the thin film transistor (TFT) structure, but not covering a top surface of the gate electrode within the thin film transistor (TFT) structure.

As is understood by a person skilled in the art, the preferred embodiment of the present invention is illustrative of the present invention rather than limiting of the present invention. Revisions may be made to methods, materials, structures and dimensions through which is fabricated a thin film transistor (TFT) structure in accord with the preferred embodiment of the present invention while still providing a thin film transistor (TFT) structure in accord with the present invention, further in accord with the accompanying claims.

What is claimed is:

1. A method for forming a thin film transistor (TFT) structure comprising:

providing a substrate;

forming over the substrate a gate electrode;

forming conformally over the gate electrode a dielectric planarizing stop layer;

forming upon the dielectric planarizing stop layer and covering the gate electrode a blanket backfilling dielectric layer;

planarizing the blanket backfilling dielectric layer, while employing the dielectric planarizing stop layer as a stop layer, to form adjacent to the gate electrode but not covering a top surface of the gate electrode a patterned backfilling dielectric layer;

forming over and covering the top surface of the dielectric planarizing stop layer and the gate electrode a gate dielectric layer;

forming over and covering the gate dielectric layer an active semiconductor layer; and forming over and in electrical communication with the active semiconductor layer a pair of source/drain electrodes, the pair of source/drain electrodes having a separation distance which defines a channel region of the active semiconductor layer.

2. The method of claim 1 wherein the substrate is employed in a microelectronic fabrication selected from the group consisting of integrated circuit microelectronic fabrications, ceramic substrate microelectronic fabrications, solar cell optoelectronic microelectronic fabrications, display image array optoelectronic microelectronic fabrications and sensor image array optoelectronic microelectronic fabrications.

3. The method of claim 1 wherein the substrate is employed within a liquid crystal display (LCD) image array optoelectronic microelectronic fabrication.

4. The method of claim 1 wherein the gate electrode is formed from a conductor material selected from the group consisting of metal conductor materials, metal alloy conductor materials, doped polysilicon conductor materials and polycide conductor materials.

5. The method of claim 1 wherein the blanket backfilling dielectric layer is formed of a backfilling dielectric material selected from the group consisting of low dielectric constant inorganic dielectric materials, low dielectric constant organic dielectric materials and low dielectric constant hybrid inorganic and organic dielectric materials.

6. The method of claim 1 wherein the blanket backfilling dielectric layer is formed of benzocyclobutene (BCB).

7. The method of claim 1 wherein the gate dielectric layer is formed from a dielectric material selected from the group including but not limited to silicon oxide dielectric materials, silicon nitride dielectric materials and silicon oxynitride dielectric materials.

8. The method of claim 1 wherein the active semiconductor layer is formed from a silicon material selected from the group consisting of amorphous silicon materials and polycrystalline silicon materials.

9. The method of claim 1 wherein the dielectric planarizing stop layer provides an enhanced planarization uniformity when forming the patterned backfilling dielectric layer from the blanket backfilling dielectric layer.

* * * * *